United States Patent [19]

Hashimoto et al.

[11] Patent Number: 5,290,666

[45] Date of Patent: Mar. 1, 1994

[54] METHOD OF FORMING A POSITIVE PHOTORESIST PATTERN UTILIZING CONTRAST ENHANCEMENT OVERLAYER CONTAINING TRIFLUOROMETHANESULFONIC, METHANESULFONIC OR TRIFLUOROMETHANEACETIC AROMATIC DIAZONIUM SALT

[75] Inventors: Michiaki Hashimoto, Sayama; Shouichi Uchino, Hachioji, both of Japan

[73] Assignees: Hitachi, Ltd.; Hitachi Chemical Company, Ltd., both of Tokyo, Japan

[21] Appl. No.: 715,694

[22] Filed: Jun. 17, 1991

Related U.S. Application Data

[63] Continuation of Ser. No. 381,876, Jul. 19, 1989, abandoned.

Foreign Application Priority Data

Aug. 1, 1988 [JP] Japan .................. 63-190641

[51] Int. Cl.$^5$ .................. G03F 7/30; G03F 7/021
[52] U.S. Cl. .................. 430/326; 430/156; 430/158; 430/163; 430/302; 430/312; 430/329
[58] Field of Search .............. 430/156, 163, 304, 311, 430/312, 322, 329, 302, 158

[56] References Cited

U.S. PATENT DOCUMENTS

| | | | |
|---|---|---|---|
| 3,219,447 | 11/1965 | Neugebauer et al. | 430/175 |
| 3,539,345 | 11/1970 | Welch . | |
| 3,679,419 | 7/1972 | Gillich | 430/175 |
| 4,469,772 | 9/1984 | Barton et al. | 430/163 |
| 4,482,489 | 11/1984 | Di Pippo | 430/176 |
| 4,499,170 | 2/1985 | Amariti et al. | 430/169 |
| 4,777,111 | 10/1988 | Blumel et al. | 430/311 |
| 4,889,795 | 12/1989 | Kaifa et al. | 430/312 |
| 4,985,344 | 1/1991 | Uchino et al. | 430/325 |

FOREIGN PATENT DOCUMENTS

| | | |
|---|---|---|
| 0102450 | 3/1984 | European Pat. Off. . |
| 0136679 | 4/1985 | European Pat. Off. . |
| 0161660 | 11/1985 | European Pat. Off. ......... 430/312 |
| 0234327 | 9/1987 | European Pat. Off. . |
| 0249941 | 12/1987 | European Pat. Off. . |
| 51-93998 | 8/1976 | Japan . |
| 59-45439 | 3/1984 | Japan . |
| 60-238829 | 11/1985 | Japan . |
| 61-219038 | 9/1986 | Japan . |
| 63-13035 | 1/1988 | Japan . |

OTHER PUBLICATIONS

English translation of pertinent portions of Semicon News 1988.8, pp. 92–98.

West, P. R. et al., "Contrast Enhanced Photolithograpy: Application of Photobleaching Processes in Microlithography", J. of Imaging Science, vol. 30, No. 2, Mar./Apr., 1986, pp. 65–68.

M. Hashimoto et al, "I-line resist for half-micron lithography" pp. 88–95, Technical Proceedings, Semicon/Japan, 1989, Nov. 13–15, Tokyo, by Semiconductor Equipment and Materials International.

*Primary Examiner*—Charles L. Bowers, Jr.
*Assistant Examiner*—Christopher G. Young
*Attorney, Agent, or Firm*—Pennie & Edmonds

[57] ABSTRACT

The present invention relates to a method of forming a pattern using a photosensitive film having bleaching properties for use as a contrast enhancing layer. The photosensitive film comprises an aromatic diazonium salt having extremely high purity content. In addition, no harmful metals are incorporated during preparation. Fine patterns of various semiconductor devices can thus be formed with high accuracy. The diazonium salt is selected from the group consisting of trifluromethanesulfonic acid salt, methanesulfonic acid salts, and trifluromethaneacetic salts of aromatic diazonium compounds.

10 Claims, No Drawings

METHOD OF FORMING A POSITIVE PHOTORESIST PATTERN UTILIZING CONTRAST ENHANCEMENT OVERLAYER CONTAINING TRIFLUOROMETHANESULFONIC, METHANESULFONIC OR TRIFLUOROMETHANEACETIC AROMATIC DIAZONIUM SALT

This is a File-wrapper-continuation application of application Ser. No. 07/381,876, filed Jul. 19, 1989, now abandoned.

BACKGROUND OF THE INVENTION

The present invention relates to an aromatic diazonium salt, a radiation sensitive composition containing the aromatic diazonium salt and a method for forming a pattern using the radiation sensitive composition. More particularly, it relates to a method for forming a pattern which is especially suitable for production of, for example, various electronic parts such as semiconductor devices, a radiation sensitive composition used for this method and an aromatic diazonium salt contained in this radiation sensitive composition.

Hitherto, photosensitive compositions or photolithographic techniques suitable for production of electronic parts such as semiconductor devices have been proposed, for example, in Japanese Patent Kokai Nos. 60-238829, 63-13035 and 59-45439. Further, diazonium salts or photosensitive compositions containing the diazonium salts have been proposed, for example, in Japanese Patent Kokai Nos. 51-93998 and 61-219038.

The above Japanese Patent Kokai No. 60-238829 shows a method which comprises providing a photosensitive film containing a photosensitive diazonium salt on a photoresist film and then carrying out pattern exposure using a light to which both the photoresist and the photosensitive diazonium salt are sensitive in order to form a very fine pattern with high resolution and to obtain an image of high contrast without reducing the sensitivity of the photoresist so much. The photosensitive film containing the photosensitive diazonium salt is considerably low in transmittance before exposure, but shows such photobleaching properties as the film becomes gradually transparent upon exposure. Therefore, when the photosensitive film is exposed to aerial image of mask, the aerial image undergoes rapid bleaching in light portion and undergoes slow bleaching in dark portion. Therefore, by utilizing such bleaching property with light, difference in exposure of photoresist in the light portion and the dark portion is greater than when the above photosensitive film is not present and thus contrast is improved.

The method disclosed in the above-mentioned Japanese Patent Kokai No. 63-13035 comprises forming an alkali-soluble polymer film on a substrate, further forming thereon a radiation sensitive composition layer containing a diazonium salt to produce a two-layer film and then forming a pattern by exposure and development in order to obtain a pattern of film having dry etching durability and high sensitivity and contrast. According to this method, a radiation-induced chemical reaction takes place at interface between these two layers and hence insolubilization markedly progresses at the two-layer interface to increase difference in solubility in developing solution between exposed area and unexposed area, thereby to obtain high contrast.

Japanese Patent Kokai No. 59-45439 relates to a radiation sensitive composition of high sensitivity and discloses a radiation sensitive composition containing a polymer which is unstable in acid and a polymerization initiator which produces acid when exposed to radiation. This composition has high sensitivity owing to acid-catalyzed amplification reaction.

Further, Japanese Patent Kokai No. 51-93998 cited above discloses a curable photosensitive composition comprising a diazonium salt and an epoxy compound.

These conventional techniques did not give consideration to the many problems which occur in production of very fine electronic parts such as LSI devices. That is, as mentioned, for example, in the above Japanese Patent Kokai No. 60-238829, diazonium salts hitherto used have halogen ion or anion produced from halogen compounds of boron, aluminum, iron, zinc, arsenic, antimony or phosphorus. These metals or semimetals cause defects in LSI devices. Further, the above Japanese Patent Kokai No. 63-13085 mentions diazonium salts containing neither metals nor semimetals, such as diazonium salt of sulfonic acid, but there is a step of using metal ions such as sodium in the course of synthesis. They also suffer from the above problems due to a slight amount of unremovable metal impurities.

SUMMARY OF THE INVENTION

The object of the present invention is to provide radiation sensitive compositions which are free from the problems seen in the conventional techniques and contain substantially no metallic impurities which cause defects in LSI devices; aromatic diazonium salts used therein; and a method for forming a pattern with the above radiation sensitive compositions.

For attaining the above object, the present invention uses aromatic diazonium salts having trifluoromethanesulfonic ion as counter ion as the above-mentioned aromatic diazonium salts and forms fine patterns using radiation sensitive compositions containing the aromatic diazonium salts.

The aromatic diazonium salt of the present invention is obtained, for example, by treating an aromatic amino compound with an alkyl nitrite in the presence of trifluoromethanesulfonic acid. The production includes no step where metallic ion is substantially present and so diazonium salt containing substantially no metallic impurities can be obtained without operation for removal of metallic impurities.

Therefore, the radiation sensitive composition containing such aromatic diazonium salt is extremely low in content of metallic impurities as compared with conventional compositions and so fine pattern can be formed without troubles caused by metallic impurities by using the above radiation sensitive composition.

In this specification, the term "radiation" is used to include generally light, electron beam and X-ray and compositions which are sensitive to this radiation is called "radiation sensitive compositions".

DETAILED DESCRIPTION OF THE PREFERRED EMBODIMENTS

The features of the present invention are enumerated below.

(1) The aromatic diazonium salts of the present invention are selected from the group consisting of trifluoromethanesulfonic acid salts, methanesulfonic acid salts and trifluoromethaneacetic acid salts of aromatic diazonium salts.

(2) The above aromatic diaznoium salts have the composition represented by the formula: $ArN_2^+X^-$ —wherein Ar represents a substituent

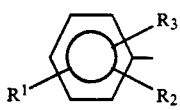

where $R_1$, $R_2$ and $R_3$ which may be identical or different each represent a hydrogen atom, a hydroxyl group, a halogen atom, a nitro group, an alkyl group of 1-6 carbon atoms, an alkoxy group of 1-6 carbon atoms, a phenyl group, an alkenyl group, a substituent denoted by

wherein $R_4$ and $R_5$ which may be identical or different each represent a hydrogen atom, an alkyl group of 1-6 carbon atoms, a phenyl group, a hydroxyalkyl group of 1-3 carbon atoms, a substituent denoted by

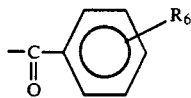

(where $R_6$ represents an alkyl group of 1-6 carbon atoms or an alkoxy group of 1-6 carbon atoms) or $R_4$ and $R_5$ may form a 3-7 membered ring through carbon atom, oxygen atom or nitrogen atom together with nitrogen atom to which $R_4$ and $R_5$ link] or a substituent denoted by

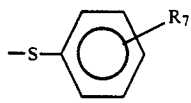

(where $R_7$ represents an alkyl group of 1-6 carbon atoms or an alkoxy group of 1-6 carbon atoms) and $X^-$ represents an ion of $CF_3SO_3^-$, $CH_3SO_3^-$ or $CF_3CO_2^-$.

(3) The aromatic diazonium salts mentioned in the above (2) are produced by diazonization of an aromatic amino compound represented by the formula $ArNH_2$ (Ar is as defined above) with an alkyl nitrite.

(4) A method for formation of a pattern which comprises forming a resist film on a substrate, forming a photosensitive film which shows bleaching with radiation on said resist film, irradiating the thus formed stacked film with radiation of desired pattern and then carrying out development to form a pattern of resist film wherein the photosensitive film contains the aromatic diazonium salt of the above (1), (2) or (3).

(5) A radiation sensitive composition which constitutes the photosensitive film of the stacked structure comprising the resist film provided on a substrate and the photosensitive film which shows bleaching with radiation provided on said resist film wherein it contains the aromatic diazonium salt of the above (1), (2) or (3).

(6) A method for forming a pattern which comprises forming an alkali-soluble polymer film on a substrate, forming a radiation sensitive composition film containing a diazonium salt on the alkali-soluble polymer film, then irradiating the resulting two-layer film with radiation of desired pattern, and then carrying out development to form a pattern of film wherein said radiation sensitive composition film contains the aromatic diazonium salt of the above (1), (2) or (3).

(7) A radiation sensitive composition which constitutes radiation sensitive composition film of two-layer film comprising an alkali-soluble polymer film formed on a substrate and radiation sensitive composition film containing diazonium salt formed on the alkali-soluble polymer film wherein the composition contains the aromatic diazonium salt of the above (1), (2) or (3).

(8) A method for forming a pattern by forming a film containing an acid precursor which produces an acid upon irradiation with radiation and a polymer compound having an acid labile group on a substrate, irradiating the film with radiation of desired pattern and carrying out development to form a pattern of the film, wherein the acid precursor is the aromatic diazonium salt of the above (1), (2) or (3).

(9) A radiation sensitive composition comprising an acid precursor which produces an acid upon irradiation with radiation and a polymer compound having an acid labile group wherein the acid precursor contains the aromatic diazonium salt of the above (1), (2) or (3).

(10) A radiation sensitive composition which comprises a compound containing an epoxy group and the diazonium salt of the above (1), (2) or (3).

(11) A radiation sensitive composition which comprises an alkali-soluble polymer compound and the aromatic diazonium salt of the above (1).

(12) A radiation sensitive composition comprising an alkali-soluble polymer compound and an aromatic diazonium salt, wherein the aromatic diazonium salts have the composition represented by the formula: $ArN_2^+X^-$, wherein Ar represents a substituent

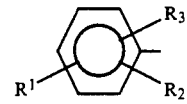

where $R_1$, $R_2$ and $R_3$ which may be identical or different each represent a hydrogen atom, a hydroxyl group, a halogen atom, a nitro group, an alkyl group of 1-6 carbon atoms, an alkoxy group of 1-6 carbon atoms, a phenyl group, an alkenyl group, a substituent denoted by

[wherein $R_4$ and $R_5$ which may be identical or different each represent a hydrogen atom, an alkyl group of 1-6 carbon atoms, a phenyl group, a hydroxyalkyl group of 1-3 carbon atoms, a substituent denoted by

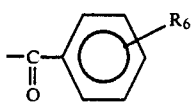

(where $R_6$ represents an alkyl group of 1-6 carbon atoms or an alkoxy group of 1-6 carbon atoms) or $R_4$ and $R_5$ may form a 3-7 membered ring through carbon atom, oxygen atom or nitrogen atom together with the nitrogen atom to which $R_4$ and $R_5$ link] or a substituent denoted by

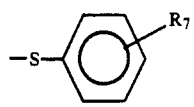

(where $R_7$ represents an alkyl group of 1-6 carbon atoms or an alkoxy group of 1-6 carbon atoms) and $X^-$ represents an ion of $CF_3SO_3^-$, $CH_3SO_3^-$ or $CF_3CO_2^-$.

(13) A positive type radiation sensitive composition which comprises an alkali-soluble polymer compound and an aromatic diazonium salt of an aromatic diazonium compound having a morpholino group with at least one acid selected from the group consisting of trifluoromethanesulfonic acid, methanesulfonic acid and trifluoroacetic acid.

The aromatic diazonium salts of the present invention can be obtained by treatment of an aromatic amino compound with an alkyl nitrite in the presence of, for example, trifluoromethanesulfonic acid. The reaction is preferably carried out in an organic solvent. The organic solvent includes, for example, alcohols, acetic acid, ketones, ethers, or esters. Especially preferred are 5-10 membered cyclic ether compounds. Use of such compounds prevents production of coloring impurities.

Trifluoromethanesulfonic acid salts are very stable and can be preserved for a long time.

The above-mentioned (4) and (5) correspond to improvement of the technique shown in the above Japanese Patent Kokai No. 60-238829. As a resist film formed on a substrate, either negative type or positive type can be used as mentioned therein.

Materials which form the photosensitive film preferably includes a water-soluble polymer together with the above-mentioned diazonium salt. Mixing ratio of them is preferably 0.5-4 parts by weight, more preferably 1-3 parts by weight of the diazonium salt per 1 part of the water-soluble polymer. As the water-soluble polymer, there may be used, for example, polyvinyl pyrrolidone, vinyl pyrrolidone/vinyl acetate copolymer, vinylmethyl ether/maleic anhydride copolymer, polyvinyl alcohol, cellulose derivatives such as methyl cellulose and other polymers such as mentioned in Japanese Patent Kokai No. 60-238829.

Thickness of the photosensitive film relates to optical density of the film and cannot be simply specified, but preferably is about 500 Å-5 μm, more preferably about 1000 Å-2 μm.

The photosensitive film may be directly provided on a resist film, but this may also be formed on an interlayer which is insoluble in solution used for forming the photosensitive film and which is provided on a resist film. This technique is disclosed in Japanese Patent Kokai No. 60-238829.

In order to obtain sufficient effect to improve contrast in the present invention, it is preferred that the photosensitive film has a sufficient optical density. For this purpose, diazonium salt with a high solubility in water and molecular absorption coefficient are suitable. If the diazonium salts are similar in solubility and molecular absorption coefficient, those which are smaller in molecular weight are advantageous for increasing optical density. The above diazonium salts are high in solubility in both water and polar organic solvents and advantageous for improvement of contrast.

The above (6) and (7) correspond to improvement of the method mentioned in Japanese Patent Kokai No. 63-13035. For the alkali-soluble polymer film formed on a substrate, there may be used polymer compounds mentioned in Japanese Patent Kokai No. 63-13035 such as polyvinyl phenol and novolak resins and other polymer compounds.

It is preferred that the radiation sensitive composition film comprises a radiation sensitive composition containing the above diazonium salt and organic polymer compound. This composition preferably contains the diazonium salt in an amount of 0.5-2 parts by weight per 1 part by weight of the organic polymer compound. The organic polymer compound is preferably a water-soluble or alkali-soluble polymer compound. As the alkali-soluble polymer compound there may be used the above-mentioned compounds and as the water-soluble polymer compound there may be used those which are shown in the above (4) and (5).

The radiation sensitive composition film preferably has a thickness of about 500 Å-1 μm. In the present invention, two or more sets each of which comprises the two-layer film of the alkali-soluble polymer film and the radiation sensitive composition film may be formed on a substrate and may be subjected to resist process.

The inventions mentioned in the above (8) and (9) relate to improvements of the techniques mentioned in Japanese Patent Kokai No. 59-45439. The polymer compounds having an acid labile group are preferably those which have substituents or bonds such as tertiary butyl ester of carboxylic acid, ether bond or acetal bond. For example, poly(p-tert-butoxycarbonyloxystyrene) and the like are used. In addition, polymer compounds having an acid labile group as disclosed in Japanese Patent Kokai No. 59-45439 and others can be used.

This composition preferably contains the diazonium salt in an amount of 0.01-0.35 part by weight, more preferably 0.1-0.3 part by weight per 1 part of the polymer compound having an acid labile group.

Conventional diazonium salts have the problem that they contain metal or semimetal and they have the further problem that they are generally low in solubility in solvents which dissolve the polymer compound having an acid labile group. On the contrary, as mentioned above, the diazonium salts of the present invention contain substantially no metallic impurities and besides are highly soluble in the solvents for the polymer compounds and hence have no such problems. Furthermore, the diazonium salts, especially trifluoromethanesulfonate and sulfate produce strong acids by photoreaction. The produced acids act as catalysts of a polymerization or depolymerization reaction. Therefore, the resist systems have the advantage of high sensitivity when used as photosensitive materials.

The above (10) corresponds to improvement of the technique mentioned in Japanese Patent Kokai No. 51-93998. This composition contains diazonium salt in an amount of preferably 0.01-0.3 part by weight, more preferably 0.1-0.3 part by weight per 1 part of the compound containing epoxy group. The compound containing epoxy group includes, for example, poly(glycidyl methacrylate) and ethyl acrylate/glycidyl methacrylate copolymer. This composition can also be cured by heating.

The above (11), (12) and (13) relate to improved radiation sensitive composition. This composition contains preferably the diaznoium salt in an amount of 0.1–0.3 part by weight per 1 part of the alkali-soluble polymer compound. When the diazonium salt is a diazonium salt having a morpholino group, positive type radiation sensitive composition is obtained. On the other hand, a negative type radiation sensitive composition is obtained when the diazonium salt does not contain morpholino group, for example, when it is a diazonium salt other than the one represented by the aforementioned formula where one of $R_1$, $R_2$ and $R_3$ is a substituent represented by

and $R_4$ and $R_5$ form a 6-membered ring through oxygen atom together with the nitrogen atom to which $R_4$ and $R_5$ are linked. Aqueous alkali solutions are preferred as developers for these compositions.

As the alkali-soluble polymer compounds, there may be used those which are mentioned above with reference to (6) and (7).

Since these diazonium salts are all good in photobleaching property, when pattern is formed using the radiation sensitive composition of the present invention, a light sufficiently reaches lower portion of film at exposure, resulting in pattern of high contrast and of excellent shape.

EXAMPLE 1

27.7 g of N,N-dimethyl-p-phenylenediamine was dissolved in 150 ml of tetrahydrofuran (hereinafter referred to as "THF") and the solution was ice-cooled. Thereto was added 31 g of trifluoromethanesulfonic acid at 5° C. and then was further added dropwise 26 g of iso-pentyl nitrite over 30 minutes at 3°–5° C. Precipitate was gradually produced. The reaction was allowed to proceed for 4 hours, followed by adding ethyl ether and precipitate was collected by filtration (55 g). This precipitate was dissolved in ethanol and added THF precipitated crystal was collected by filtration to obtain 40 g (yield 70%) of a yellow crystal of 4-(N,N-dimethylamino)benzenediazonium trifluoromethanesulfonate. m.p. (dec.) 127°–128° C.; absorption maximum wavelength ($\lambda_{max}$): 376 nm; molar absorption coefficient ($\epsilon$: $1.\text{mol}^{-1}.\text{cm}^{-1}$) $3.4 \times 10^4$ (in ethanol) UV spectrum, IR spectrum, NMR spectrum and elemental analysis showed that the resulting crystal was the above-mentioned compound.

EXAMPLE 2

Example 1 was repeated except that ethanol was used in place of THF as a solvent. In this case, reaction mixture colored deep green and the resulting crystal also colored deeply. Therefore, purification steps must be increased and yield decreased to about 50%, but a diazonium salt having the same composition as that of the product in Example 1 was obtained.

EXAMPLE 3

Example 1 was repeated except that 2,5-di-t-butoxy-4-morpholinoaniline was used in place of N,N-dimethyl-p-phenylenediamine to obtain a yellow crystal of 2,5-di-t-butoxy-4-morpholinobenzenediazonium trifluoromethanesulfonate having a melting point of 90°–91° C. in yield of 63%.

$\lambda_{max} = 402$ nm and $\epsilon = 2.7 \times 10^4$ ($1.\text{mol}^{-1}.\text{cm}^{-1}$).

EXAMPLE 4

Example 1 was repeated except that 4-morpholino-2,5-di-i-propoxyaniline was used in place of the amino compound used in Example 1, thereby to obtain a yellow crystal of 4-morpholino-2,5-di-i-propoxybenzenediazonium trifluoromethanesulfonate in a yield of 65%. m.p. (dec.)=118°–120° C., $\lambda_{max} = 402$ nm, and $\epsilon = 2.2 \times 10^4$ ($1.\text{mol}^{-1}.\text{cm}^{-1}$).

EXAMPLE 5

Example 1 was repeated except that 2,5-dimethyl-4-(N,N-dimethylamino)aniline was used in place of the amino compound used in Example 1, thereby to obtain 2,5-dimethyl-4-(N,N-dimethylamino)benzenediazonium trifluoromethanesulfonate in a yield of 70%. Decomposition point=113°–114° C., $\lambda_{max} = 392$ nm, and $\epsilon = 2.7 \times 10^4$ ($1.\text{mol}^{-1}.\text{cm}^{-1}$) (in ethanol).

EXAMPLE 6

Example 1 was repeated except that 4-aminophenol was used in place of the amino compound used in Example 1 and ethanol was used as a solvent, thereby to obtain 4-hydroxybenzenediazonium trifluoromethanesulfonate in a yield of 70%. m.p.=108°–109° C.; $\lambda_{max} = 314$ nm (acidic); $\epsilon = 1.4 \times 10^4$ ($1.\text{mol}^{-1}.\text{cm}^{-1}$).

EXAMPLE 7

Example 6 was repeated except that p-anisole was used in place of the amino compound used in Example 6, thereby to obtain 4-methoxybenzenediazonium trifluoromethanesulfonate in a yield of 75%. m.p.=90°–91.5° C.; $\lambda_{max} = 312$ nm; $\epsilon = 2.4 \times 10^4$ ($1.\text{mol}^{-1}.\text{cm}^{-1}$).

EXAMPLE 8

Example 1 was repeated with changing amino compounds used as starting materials and reaction solvents to obtain the following diazonium trifluoromethanesulfonates. Names of the resulting compounds, solvents and properties are shown in Table 1. Names of starting amino compounds are omitted because they are clearly known from the corresponding products. In addition, diazonium sulfates, diazonium trifluoroacetates and diazonium methanesulfonates were also obtained using, in place of the trifluoromethane sulfonic acid, equal mols of sulfuric acid, trifluoroacetic acid and methanesulfonic acid, respectively. These are shown in Tables 2, 3 and 4, respectively.

TABLE 1

| Diazonium compound | ($X^- = CF_3SO_3^-$) | | Reaction solvent |
| --- | --- | --- | --- |
| | $\lambda_{max}$ (nm) | $\epsilon$ ($l \cdot mol^{-1} \cdot cm^{-1}$) $\times 10^4$ | |
| 4-(N,N-diethylamino)-benzenediazonium | 380 | 3.8 | THF |
| 4-(N,N-dimethylamino)-3-methoxybenzenediazonium | 405 | 3.1 | THF |
| 4-(N,N-dimethylamino)-3-ethoxybenzenediazonium | 405 | 3.1 | Acetic acid |
| 4-(N,N-dimethylamino)-2-methylbenzenediazonium | 380 | 3.8 | Acetic acid |
| 3,5-dibromo-4-hydroxy-benzenediazonium | 350 | 4.4 | Ethanol |
| 4-(N,N-dimethylamino)-2,5- | 394 | 3.1 | THF |

TABLE 1-continued

| Diazonium compound | ($X^- = CF_3SO_3^-$) $\lambda_{max}$ (nm) | $\epsilon$ (l·mol$^{-1}$·cm$^{-1}$) × 10$^4$ | Reaction solvent |
|---|---|---|---|
| dimethylbenzenediazonium | | | |
| 4-(N,N-dimethylamino)-2,6-dimethylbenzenediazonium | 375 | 2.7 | Acetic acid |
| 4-(N,N-dimethylamino)-2-methoxybenzenediazonium | 365 | 3.4 | Acetic acid |
| 4-(N,N-dimethylamino)-3-hydroxybenzenediazonium | 386 | 3.1 | THF |
| 4-Hydroxy-3,5-dimethyl-benzenediazonium | 364 | 3.0 | Ethanol |
| 4-Hydroxy-2,5-dimethyl-benzenediazonium | 356 | 2.1 | Ethanol |
| 4-Benzoylamino-2,5-dimethoxybenzenediazonium | 380 | 3.1 | Acetic acid |
| 4-(N-ethyl-N-hydroxyethyl-amino)benzenediazonium | 381 | 4.5 | THF |
| 4-Methoxy-2-nitrobenzene-diazonium | 256 | 1.7 | THF |
| 4-Chloro-2-methylbenzene-diazonium | 281 | 1.7 | THF |
| 2-Methoxy-5-nitrobenzene-diazonium | 247 | 1.3 | Acetic acid |
| 2-Methoxy-4-nitrobenzene-diazonium | 218 | 1.1 | Ethanol |
| 2,5-Diethoxy-4-(4-tolyl-mercapto)benzenediazonium | 405 | 3.1 | THF |
| 4-Morpholinobenzenedi-azonium | 380 | 2.7 | Acetic acid |
| 2,5-Diethoxy-4-morpholino-benzenediazonium | 402 | 2.7 | Acetic acid |
| 2,5-Diethoxy-4-(4-methoxy-benzoylamino)-benzenediazonium | 395 | 2.7 | THF |
| 2,5-Dibutoxy-4-(4-methoxy-phenylmercapto)-benzenediazonium | 408 | 2.7 | THF |
| 3-Methyl-4-pyrrolidino-benzenediazonium | 380 | 3.0 | Acetic acid |
| 4-Diazodiphenylamine | 380 | 3.0 | Acetic acid |

TABLE 2

| Diazonium compound | ($X^- = HSO_4^-$) $\lambda_{max}$ (nm) | $\epsilon$ (l·mol$^{-1}$·cm$^{-1}$) × 10$^4$ | Reaction solvent |
|---|---|---|---|
| 4-(N,N-diethylamino)-benzenediazonium | 376 | 4.0 | Acetic acid |
| 2,5-Dibutoxy-4-morpholino-benzenediazonium | 402 | 2.7 | Ethanol |
| 2,5-Dipropoxy-4-morpholino-benzenediazonium | 402 | 3.1 | Acetic acid |
| 4-(N-ethyl-N-hydroxyethyl)-benzenediazonium | 381 | 4.6 | Ethanol |
| 4-Morpholinobenzenedi-azonium | 378 | 3.5 | Acetic acid |

TABLE 3

| Diazonium compound | ($X^- = CF_3CO_2^-$) $\lambda_{max}$ (nm) | $\epsilon$ (l·mol$^{-1}$·cm$^{-1}$) × 10$^4$ | Reaction solvent |
|---|---|---|---|
| 4-(N,N-diethylamino)-benzenediazonium | 378 | 2.0 | Trifluoroacetic acid |
| 2,5-Dibutoxy-4-morpholino-benzenediazonium | 402 | 2.7 | Acetic acid |

TABLE 4

| Diazonium compound | ($X^- = CF_3SO_3^-$) $\lambda_{max}$ (nm) | $\epsilon$ (l·mol$^{-1}$·cm$^{-1}$) × 10$^4$ | Reaction solvent |
|---|---|---|---|
| 4-(N,N-diethylamino)-benzenediazonium | 376 | 4.0 | Acetic acid |
| 2,5-Dibutoxy-4-morpholino-benzenediazonium | 402 | 2.7 | Acetic acid |

EXAMPLE 9

A photosensitive composition comprising 10 parts by weight of 4-(N,N-dimethylamino)-3-ethoxybenzenediazonium trifluoromethanesulfonate, 6 parts by weight of vinylpyrrolidone/vinyl acetate copolymer, 60 parts by weight of acetic acid, the balance being water, was prepared.

First, a solution of commercially available positive type photoresist OFPR-800 (trademark for resist of Tokyo Oka Kogyo Co.) of 20 centipoises was coated on a silicon wafer to form a photoresist film. On this film was spin-coated a 0.5% aqueous poly(vinyl alcohol) solution to form an interlayer, followed by baking at 80° C. for 20 minutes. Thickness of the photoresist film was 1 μm and that of the interlayer was 0.2 μm. Thereafter, the solution of photosensitive composition prepared above was coated on the film by a spinner and baked in air at 80° C. for 3 minutes to form a photosensitive film of 0.45 μm thick having a photobleaching property.

This was exposed by g-line reduction projection aligner RA501 of Hitachi Limited and then was developed with water to remove the photosensitive film having a photobleaching property and the interlayer and immersed in a 2.38 wt % aqueous tetramethylammonium hydroxide solution as a developer for 40 seconds to develop the photoresist film. The sample was taken out and electron-microphotographed and the resulting pattern was examined to find that contrast was markedly improved.

Heat decomposition rate constant k of the solution of photosensitive composition at 5° C. was measured to obtain k (5° C.)=1.5×10$^{-6}$ hr$^{-1}$, which means that the composition was extremely stable.

Pattern of photoresist film was formed by the same process as above in making a semiconductor device, but no adverse effect was given to the resulting semiconductor device.

EXAMPLE 10

A photosensitive composition comprising 12 parts by weight of 2,5-di-iso-propoxy-4-morpholinobenenediazonium trifluoromethanesulfonate, 6.5 parts by weight of vinylpyrrolidone/vinyl acetate copolymer, 60 parts of acetic acid, the balance being water, was prepared. Pattern of photoresist film was formed in the same manner as in Example 9 except that thickness of photosensitive film having a photobleaching property formed using the above solution was 0.7 μm. Contrast of the pattern was markedly improved.

Pattern of photoresist film was formed by the same process as above in making a semiconductor device, but no adverse effect was given to the resulting semiconductor device.

EXAMPLE 11

A solution of a photosensitive composition comprising 12 parts by weight of 2,5-di-iso-propoxy-4-morpholinobenzenediazonium trifluoromethanesulfonate, 6.5 parts by weight of vinylpyrrolidone/vinyl acetate copolymer, 60 parts of acetic acid, 0.37 part by weight of hydrochloric acid, the balance being water, was prepared. Pattern of photoresist film was formed in the same manner as in Example 9. It was recognized that contrast of the pattern was markedly improved.

Pattern of photoresist film was formed by the same process as above in making a semiconductor device, but no adverse effect was given to the resulting semiconductor device.

EXAMPLE 12

A solution of a photosensitive composition comprising 6 parts by weight of 4-(N,N-dimethylamino)benzenediazonium trifluoromethanesulfonate, 7 parts by weight of vinylpyrrolidone/vinyl acetate copolymer, 60 parts by weight of acetic acid, the balance being water, was prepared.

A sample for exposure was prepared in the same manner as in Example 9. This was exposed by i-line reduction projecting exposure device RA501 of Hitachi Limited and then was developed with water to remove the photosensitive film having a photobleaching property and development was carried out with 2.38 wt % aqueous tetramethylammonium hydroxide solution as a developer for 40 seconds. The resulting pattern was electron-microphotographed and examined to find that contrast was markedly improved.

Heat decomposition rate constant k of the solution of photosensitive composition at 5° C. was k (5° C.)=$1.4 \times 10^{-7}$ hr$^{-1}$, which means that the composition was extremely stable.

Pattern of photoresist film was formed by the same process as above in making a semiconductor device, but no adverse effect was given to the resulting semiconductor device.

EXAMPLE 13

A 15 wt % solution of polyvinylphenol (Malkalinker of Maruzen Petrochemical Co.) in cyclohexanone was spin-coated on a silicon wafer to form a polyvinylphenol layer of about 1 μm thick, which was baked at 140° C. for 20 minutes. Then, on this polyvinylphenol layer was formed a radiation sensitive composition layer of 0.25 μm thick containing an aromatic diazonium salt using an aqueous solution having the following composition. This was used as a sample for exposure.

| | |
|---|---|
| 4-(N,N-dimethylamino)-2,5-dimethylbenzenediazonium trifluoromethanesulfonate | 5 wt % |
| N-vinylpyrrolidone/vinyl acetate copolymer | 5 wt % |
| Hydrochloric acid | 1 wt % |
| Surfactant (Pluronic L-92 of Asahi Denka Kogyo Co.) | 0.01 wt % |
| Water | balance |

This sample for exposure was exposed to Xe-Hg lamp of Hannovia Co. through VY-43 filter (g-line) of Toshiba Ltd. or UV D2 filter (i-line) of Toshiba Ltd. with changing exposure time, washed with water to remove the radiation sensitive layer and then immersed in an aqueous solution containing 1 wt % of tetramethylammonium hydroxide for 45 seconds to perform development. After development, the remaining film thickness was measured for every exposure time and photosensitive characteristics were evaluated. It was found from photosensitive characteristic curve that contrast in i-line was 3.3 and that in g-line was 6.0. Thus, it can be seen that when stacked film resist is used, high contrast is obtained and sensitivity is nearly equal to that of AZ type positive photoresist (OFPR800 of Tokyo Oka Kogyo Co.) and good photosensitive characteristics are obtained. When the above sample for exposure was exposed with fine pattern by g-line reduction projecting type exposure device of Hitachi Limited, pattern of high resolution was obtained.

Furthermore, pattern of photoresist film was formed by the same process as above in making a semiconductor device, but no adverse effect was given to the resulting semiconductor device.

Moreover, good photosensitive characteristics were obtained also when diazonium salts as shown in the Tables in Example 8 were used in place of the above aromatic diazonium salt in the above composition.

EXAMPLE 14

Film was formed under the same conditions as in Example 13 except that instead of the polyvinylphenol, a diazonquinone positive photoresist (OFPR800 of Tokyo Oka Kogyo Co.) was coated to a thickness of 0.8 μm on a silicon wafer, baked at 80° C. for 20 minutes and then exposed to Xe-Hg lamp to completely decompose the photosensitive material and that 2.38 wt % tetramethylammonium hydroxide was used as a developer. The resulting film had good photosensitive characteristics.

EXAMPLE 15

A 20 wt % solution of cresol novolak resin in ethyl cellosolve acetate was spin-coated on a silicon wafer to form a cresol novolak resin layer of about 0.6 μm thick and baked at 80° C. for 1 minute. Then, on this cresol novolak resin layer was formed a radiation sensitive composition layer of 0.35 μm thick and containing a diazonium salt using an aqueous solution having the following composition. This was used as a sample for exposure.

| | |
|---|---|
| 4-(N,N-dimethylamino)-2-methoxybenzenediazonium trifluoromethanesulfonate | 4 wt % |
| N-vinylpyrrolidone/vinyl acetate copolymer | 5 wt % |
| Acetic acid | 50 wt % |
| Water | balance |

This sample was treated in the same manner as in Example 13 except that UVD2 filter was used for exposure and 2.38 wt % aqueous tetramethylammonium hydroxide solution was used as a developer and then photosensitive characteristics were evaluated. It was recognized that it had good photosensitive characteristics. Contrast value in i-line was 3.1.

EXAMPLE 16

The sample for exposure shown in Example 13 was irradiated with electron beam with changing dosage by EB patterning device of Hitachi Limited and thereafter was developed with 0.8 wt % aqueous tetramethylammonium hydroxide solution for 4 minutes. After development, the remaining film thickness was measured for each dosage and an electron beam sensitivity curve showing relation therebetween was prepared. Based on this curve, electron beam sensitivity characteristics were evaluated to find that it had good electron beam sensitivity characteristics.

EXAMPLE 17

A photosensitive solution comprising 20% by weight of poly(p-t-butyloxycarbonyloxy)styrene, 4% by weight of 4-(N,N-dimethylamino)benzenediazonium trifluoromethanesulfonate and 76% by weight of cyclohexanone was prepared. This solution was spin-coated on a silicon wafer to form a resist film of 0.8 μm thick. This film was baked at 80° C. for 20 minutes and exposed to ultraviolet ray at a dosage of 5-10 mJ/cm$^2$. This was baked at 80° C. for 30 minutes and then developed with a 2.38% aqueous tetramethylammonium hydroxide solution, thereby to obtain a positive resist pattern of high resolution.

EXAMPLE 18

A photosensitive solution was prepared and resist film was formed in the same manner as in Example 17 except that poly(t-butyl methacrylate) was used in place of poly(p-t-butyloxycarbonyloxy)styrene. Then, this resist film was exposed, baked and developed in the same manner as in Example 17 to form a positive resist pattern of high resolution.

EXAMPLE 19

A photosensitive solution comprising 20% by weight of poly(ethylene oxide), 4% by weight of 4-(N,N-dimethylamino)benzenediazonium trifluoromethanesulfonate and 76% by weight of water was prepared and spin-coated on a silicon wafer to form a film of 0.6 μm thick. This was irradiated with ultraviolet ray (10 mJ/cm$^2$) and baked at 50° C. to form a positive pattern of high resolution.

EXAMPLE 20

A photosensitive solution comprising 20% by weight of poly(phthalaldehyde), 4% by weight of 2,5-dibutoxy-4-morpholinobenzenediazonium trifluoromethanesulfonate and 76% by weight of cyclohexanone was prepared and was spin-coated on a silicon wafer to form a film of 0.6 μm thick. This was irradiated with a light of 436 nm and baked at 90° C. to form a positive pattern of high resolution.

Furthermore, using the same photosensitive solutions as in Examples 17-20, positive patterns were formed for making a semiconductor device by the same process as above. No adverse effect was seen in the resulting semiconductor device.

EXAMPLE 21

A photosensitive solution comprising 20% by weight of poly(glycidyl methacrylate), 4% by weight of 2,5-dimethyl-4-(N,N-dimethylamino)benzenediazonium trifluoromethanesulfonate and 76% by weight of methyl cellosolve acetate was prepared and was spin-coated on a silicon wafer to form a film of 0.9 μm thick. This was irradiated with a light from mercury lamp (5 mJ/cm$^2$) and developed with a solution of ethylmethyl ketone/ethanol in 7/1 to obtain a negative pattern.

Further, a pattern of photoresist film was formed in making a semiconductor device by the same process as above. No adverse effect was seen in the resulting semiconductor device.

EXAMPLE 22

A photosensitive solution comprising 20% by weight of cresol novolak resin, 4% by weight of allyl-2,4,6-trihydroxymethylphenyl ether and 4% by weight of 4-(N,N-dimethylamino)benzenediazonium trifluoromethanesulfonate was spin-coated on a silicon wafer to obtain a film of 0.8 μm thick. This was irradiated with ultraviolet ray of 10 mJ/cm$^2$, baked at 90° C. and developed with a 2.38% aqueous tetramethylammonium hydroxide solution to obtain a negative tone pattern of high resolution.

Furthermore, in making a semiconductor device, a pattern of photoresist film was formed by the same process as above. No adverse effect was seen in the resulting semiconductor device.

EXAMPLE 23

The photosensitive film shown in Example 22 was irradiated with electron beam (30 keV) of 5 μC/cm$^2$, baked at 90° C. and developed with a 2.38 wt % aqueous tetramethylammonium hydroxide solution to obtain a negative type resist pattern of high resolution.

EXAMPLE 24

A photosensitive solution was prepared and a resist film was formed therefrom and subjected to exposure, baking and development in the same manner as in Example 17 except that poly(4-trimethylsiloxy)styrene was used in place of poly(p-t-butyloxycarbonyloxy)styrene. Thus, a positive type resist pattern of high resolution was formed.

EXAMPLE 25

A photosensitive solution comprising 20% by weight of cresol novolak resin, 4% by weight of 2,5-dibutoxy-4-morpholinobenzenediazonium trifluoromethanesulfonate and 76% by weight of cyclohexanone was prepared. This solution was spin-coated on a silicon wafer to form a film of 1 μm thick. This film was irradiated with a light of 436 nm at 8 mJ/cm$^2$ and then developed with a 1.0 wt % aqueous tetramethylammonium hydroxide solution, thereby to obtain a positive type pattern of high resolution and markedly high contrast.

EXAMPLE 26

A photosensitive solution comprising 20% by weight of polyvinylphenol, 4% by weight of 4-(N,N-dimethylamino)benzenediazonium trifluoromethanesulfonate and 76% by weight of cyclohexanone was prepared and spin-coated on a silicon wafer to form a film. This was exposed and then developed with a 1 wt % aqueous tetramethylammonium hydroxide to obtain a negative type resist film very high in contrast and excellent in shape. Furthermore, using the photosensitive solutions of Examples 25 and 26, patterns of film were formed by the same process as above in making semiconductor device. No adverse effect was seen in the resulting semiconductor device.

According to the present invention, an aromatic diazonium salt containing substantially no metallic compounds or metallic impurities can be produced by a simple process which does not need troubles to remove metallic impurities and hence does not bring about decrease of yield. Furthermore, when this diazonium salt is used as a photosensitive material, fine patterns can be formed with high sensitivity, high resolution and good line-width control. Moreover, a radiation sensitive composition having no possibility of damaging reliability of semiconductor device can be obtained.

Conventionally used diazonium salts, for example, double salt of 4-N,N-dimethylaminobenzenediazonium and zinc chloride contains 18 wt % of zinc which may cause defects in semiconductor devices and besides contains several % of metallic ion as impurity because compounds containing metal is used for preparation thereof.

On the other hand, the diazonium salts such as 4-N,N-dimethylaminobenzenediazonium trifluoromethanesulfonate of the present invention contain no elements which may cause defects of semiconductor devices such as zinc and boron and besides contain no elements which may cause defects of semiconductor devices as impurities because no compounds containing metals are used for preparation thereof. This has been confirmed by analysis of impurities according to emission spectroscopic analysis.

What is claimed is:

1. A method of forming a pattern in contrast enhancement lithography comprising the steps of:

coating a positive-type photoresist on a substrate to form a positive-type photoresist film;

forming a photosensitive film, which has a different composition than said photoresist film, over said photoresist film, said photosensitive film consisting essentially of an admixture of a water-soluble organic polymer compound and an aromatic diazonium salt which is selected from the group consisting of trifluromethanesulfonic acid salt, methanesulfonic acid salts, and trifluromethaneacetic salts, said photosensitive film having bleaching property with radiation on said photoresist film to form a stacked film, mixing ratio of said aromatic diazonium salt to said water-soluble organic polymer compound being 0.5–4:1 by weight;

irradiating the stacked film with radiation of desired pattern;

removing said photosensitive film with a solvent prior to development of said photoresist film or with a developing solution during said development;

developing said photoresist film with the developing solution to form a pattern of said photoresist film by removing the irradiated portion of said photoresist film.

2. A method of forming a pattern according to claim 1, wherein the water-soluble organic compound is selected from the group consisting of polyvinylpyrrolidone, vinylpyrrolidone/vinyl acetate copolymer, vinylmethyl ether/maleic anhydride copolymer, polyvinyl alcohol, and methylcellulose derivative.

3. A method of forming a pattern according to claim 2, wherein said aromatic diazonium salt is produced by diazotization of an aromatic amino compound represented by the formula $ArNH_2$.

4. A method of forming a pattern according to claim 1, wherein said mixing ratio of said aromatic diazonium salt to said water-soluble organic polymer compound is 1–3:1 by weight.

5. A method of forming a pattern according to claim 1, wherein said photosensitive film has a thickness of 500 Angstrom to 5 $\mu$m.

6. A method of forming a pattern according to claim 5, wherein said photosensitive film has a thickness of 1000 Angstrom to 2 $\mu$m.

7. A method of forming a pattern in contrast enhancement lithography comprising the steps of:

coating a positive-type photoresist on a substrate to form a positive-type photoresist film;

forming a photosensitive film, which has a different composition than said photoresist film, over said photoresist film, said photosensitive film consisting essentially of an admixture of a water-soluble organic polymer compound and an aromatic diazonium salt represented by the formula $ArN_2^+X^-$, where $X^-$ represents an ion selected from the group consisting of $CF_3SO_3^-$, $CH_3SO_3^-$, $CF_3CO_2^-$ and Ar represents a substituent

where $R_1$, $R_2$, $R_3$ may be identical or different, each representing a hydrogen atom, a halogen atom, an alkyl group of 1–6 carbon atoms, an alkoxy group of 1–6 carbon atoms, or a substituent denoted by

where $R_4$ and $R_5$ may be identical or different, each representing a hydrogen atom, an alkyl group of 1–6 carbon atoms, a hydroxyalkyl group of 1–3 carbon atoms, or wherein $R_4$ and $R_5$ may form a 3–7 membered ring through carbon atom, oxygen atom or nitrogen atom together with nitrogen atom to which $R_4$ and $R_5$ are linked, or a substituent denoted by

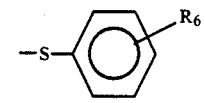

where $R_6$ represents an alkyl group of 1–6 carbon atoms or an alkoxy group of 1–6 carbon atoms, mixing ratio of said aromatic diazonium salt to said water-soluble organic polymer compound being 0.5–4:1 by weight, wherein said photosensitive film has bleaching property with radiation on said photoresist film to form a stacked film;

irradiating the stacked film with radiation of desired pattern;

removing said photosensitive film with a solvent prior to development of said photoresist film or with a developing solution during said development; and developing said photoresist film with the developing solution to form a pattern of said photoresist film by removing the irradiated portion of said photoresist film.

8. A method of forming a pattern according to claim 7, wherein said mixing ratio of said aromatic diazonium salt to said water-soluble organic polymer compound is 1–3:1 by weight.

9. A method of forming a pattern according to claim 7, wherein said photosensitive film has a thickness of 500 Angstrom to 5 $\mu$m.

10. A method of forming a pattern according to claim 9, wherein said photosensitive film has a thickness of 1000 Angstrom to 2 $\mu$m.

* * * * *